(12) United States Patent
Zavadsky et al.

(10) Patent No.: US 11,024,935 B2
(45) Date of Patent: Jun. 1, 2021

(54) APPARATUSES FOR POWER COMBINING AND POWER DIVIDING

(71) Applicant: CommScope Technologies LLC, Hickory, NC (US)

(72) Inventors: Dean Zavadsky, Shakopee, MN (US); Gilberto Guerra, Denton, TX (US); Michael Nelson, Prior Lake, MN (US); Brogan McWilliams, Minneapolis, MN (US)

(73) Assignee: CommScope Technologies LLC, Hickory, NC (US)

( * ) Notice: Subject to any disclaimer, the term of this patent is extended or adjusted under 35 U.S.C. 154(b) by 149 days.

(21) Appl. No.: 16/011,435

(22) Filed: Jun. 18, 2018

(65) Prior Publication Data
US 2019/0020093 A1    Jan. 17, 2019

Related U.S. Application Data

(60) Provisional application No. 62/530,943, filed on Jul. 11, 2017.

(51) Int. Cl.
| | |
|---|---|
| H01Q 1/48 | (2006.01) |
| H01P 5/12 | (2006.01) |
| H01P 3/08 | (2006.01) |
| H03F 3/24 | (2006.01) |
| H03F 3/19 | (2006.01) |
| H01Q 1/24 | (2006.01) |
| H01Q 21/00 | (2006.01) |
| H03H 11/34 | (2006.01) |

(52) U.S. Cl.
CPC .................. *H01P 5/12* (2013.01); *H01P 3/08* (2013.01); *H01Q 1/246* (2013.01); *H01Q 21/0075* (2013.01); *H03F 3/19* (2013.01); *H03F 3/245* (2013.01); *H03H 11/344* (2013.01); *H03F 2200/294* (2013.01); *H03F 2200/315* (2013.01); *H03F 2200/451* (2013.01)

(58) Field of Classification Search
CPC ............ H01Q 25/00; H01Q 9/16; H01Q 9/18; H01Q 13/02; H01Q 13/06; H01Q 13/04; H01Q 9/44; H01Q 9/46; H01Q 9/12
USPC ........ 343/720, 725–730, 772–774, 798, 800, 343/805–809
See application file for complete search history.

(56) References Cited

U.S. PATENT DOCUMENTS

| | | |
|---|---|---|
| 5,218,322 A | 6/1993 | Allison et al. |
| 6,037,840 A | 3/2000 | Myer |
| 7,898,356 B2 * | 3/2011 | Sherrer ................. H01P 11/005 333/34 |

(Continued)

OTHER PUBLICATIONS

Ghanadi, "A New Compact Broadband Radial Power Combiner", Berlin 2012, pp. 116.

(Continued)

*Primary Examiner* — Binh B Tran
(74) *Attorney, Agent, or Firm* — Fogg & Powers LLC

(57) ABSTRACT

A stripline radial power combiner is provided. The stripline radial combiner comprises a first stripline level comprising N radial combiner arms coupled to a first common node; a second stripline level comprising a common port coupled to a second common node; wherein the first stripline level is mounted over the second stripline level; and wherein the first common node and the second common node are coupled by a conductive via through the first stripline level and the second stripline level.

24 Claims, 15 Drawing Sheets

(56) References Cited

U.S. PATENT DOCUMENTS

| | | | | |
|---|---|---|---|---|
| 9,065,163 B1* | 6/2015 | Wu | ............... | H03F 3/195 |
| 2005/0030124 A1* | 2/2005 | Okamoto | ............... | H01P 5/10 |
| | | | | 333/127 |
| 2011/0043301 A1* | 2/2011 | Huettner | ............... | H01P 5/16 |
| | | | | 333/136 |
| 2012/0062335 A1* | 3/2012 | Sherrer | ............... | H01P 3/06 |
| | | | | 333/127 |
| 2014/0028516 A1 | 1/2014 | Semonov et al. | | |
| 2014/0218254 A1 | 8/2014 | Kitchener | | |
| 2016/0248170 A1 | 8/2016 | Bisiules et al. | | |

OTHER PUBLICATIONS

Microwaves101, "Klopfenstein Taper", "https://www.microwaves101.com/encyclopedias/klopfenstein-taper", Retrieved May 14, 2018, pp. 1-8.

York, "Some Considerations for Optimal Efficiency and Low Noise in Large Power Combiners", "Submitted to IEEE Transactions on Microwave Theory and Techniques", Aug. 2001, pp. 1-6, Publisher: IEEE.

International Searching Authority, "International Search Report and Written Opinion from PCT Application PCT/US2018/038104 dated Dec. 11, 2018"; From PCT Counterpart of U.S. Appl. No. 16/011,435; pp. 1-13; Published in WO.

International Bureau, "International Preliminary Report on Patentability from PCT Application No. PCT/US2018/038104", from Foreign Counterpart to U.S. Appl. No. 16/011,435, dated Jan. 23, 2020, pp. 1-10, Published: WO.

European Patent Office, "Extended European Search Report from EP Application No. 18831604.6", from Foreign Counterpart to U.S. Appl. No. 16/011,435, dated Mar. 12, 2021, p. 1-12, Published: EP.

Fathy et al. "A Simplified Design Approach for Radial Power Combiners", IEEE Transactions on Microwave Theory and Techniques, Jan. 2006, p. 247-255, vol. 54, No. 1, IEEE.

Roy et al. "Novel N-way Power Divider and Array Configuration for RFID readers operating at 5.8 GHz", IEEE International Conference on RFID, Apr. 2008, p. 89-96, IEEE.

\* cited by examiner

APPARATUSES FOR POWER COMBINING AND POWER DIVIDING

CROSS-REFERENCE TO RELATED APPLICATIONS

The present application claims benefit of U.S. patent application Ser. No. 62/530,943, filed Jul. 11, 2017; the entire content of the aforementioned patent application is incorporated herein by reference as if set forth in its entirety.

BACKGROUND

A Long Term Evolution (LTE) wireless network includes an Evolved Universal Terrestrial Radio Access Network (E-UTRAN) (also sometimes referred to simply as the "radio access network" or "RAN") and an Evolved Packet Core (EPC) network (also sometime referred to simply as the "core network").

The E-UTRAN comprises a set of base stations that wirelessly communicate with user equipment (such as smartphones) using licensed radio frequency spectrum. Each base station is also generally referred to as an "eNodeB" or "eNB."

One type of eNodeB is a "macro" eNodeB (or eNodeB macro cell), which is a higher-power base station that is typically used to provide base station capacity in a relatively large area that includes both outdoor areas and indoor areas. In general, each location within a service provider's network is notionally within the coverage area of at least one macro eNodeB. However, in practice, there are some locations (for example, within homes and office buildings) for which good coverage cannot be provided by any macro eNodeB in an operator's network. Also, there may be some locations (for example, within public venues such as office buildings, stadiums, airports, etc.) where a large number of users congregate during certain periods. During those periods, the associated macro eNodeBs may not be able provide sufficient base-station capacity to the congregated users, even if it is possible to provide sufficient wireless coverage.

To remedy such coverage and capacity issues, LTE wireless networks commonly include eNodeBs that are "small cells" or "femtocells," and distributed antenna systems (DASs). The small cell is a lower-power base station, and can provide improved wireless local coverage and/or capacity. This is done by deploying the small cell directly with the location that has a coverage and/or capacity issue. Similarly, distributed antenna systems may be coupled to one or more eNodeBs, and provide the same benefit.

The eNodeB macrocells, eNodeB small cells, and distributed antenna systems communicate with User Equipment (UE) such as cell phones. The eNodeB macrocell transmitters that generate downlink signals having relatively high power levels, e.g. 20-70 W. Cell phone transmitters generate uplink signals have relatively small output power levels, e.g. ¼ W. However, other wireless infrastructure systems, such as small cells and distributed antenna systems operate at power levels between cell phones and eNodeB macrocells.

To cost effectively build such other wireless infrastructure systems, it is desirable to use cell phone components which are mass produced and reasonably priced. However, cell phone components are designed to operate at lower power levels, or will prematurely fail if operated at higher power levels. Therefore, there is a need to facilitate use of components designed for cell phones in such wireless infrastructure systems.

SUMMARY OF THE INVENTION

A stripline radial power combiner is provided. The stripline radial combiner comprises a first stripline level comprising N radial combiner arms coupled to a first common node; a second stripline level comprising a common port coupled to a second common node; wherein the first stripline level is mounted over the second stripline level; and wherein the first common node and the second common node are coupled by a conductive via through the first stripline level and the second stripline level.

DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

Embodiments described below provide a technique to enable wireless infrastructure such as small cells and distributed antenna systems to utilize low cost cell phone components. Because cell phone power amplifiers do not provide sufficient power output for transmitters in such wireless infrastructure, a stripline radial power combiner is described that permits combining the power output of two or more power amplifiers in parallel. Further, the stripline power combiner facilitates the use of duplexer and multiplexers having low power handling ratings. Unlike other electromagnetic power combiners, the stripline radial power combiner substantially maintains phase matching amongst each radial arm, has a single arm for each port reducing insertion loss, and reduces routing complexity to external components. Also, the stripline radial power combiners can be stacked to implement a system of stripline radial power combiners. Finally, stripline radial power combiners can be readily mounted on printed circuit boards proximate to components to which they are to be coupled.

Figure 1:
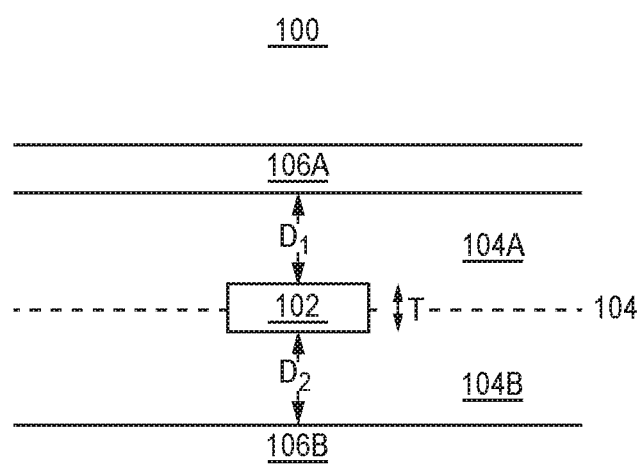
FIG. 1 illustrates a cross-section of one embodiment of a stripline.

Stripline is a form of a planar transverse electromagnetic (TEM) transmission line. FIG. 1 illustrates a cross section of one embodiment of stripline 100. Stripline 100 comprises a center conductor 102 in a dielectric (or dielectric layer) 104. The top dielectric 104A and bottom of dielectric 104B, at least about the center conductor, are respectively covered by an upper conductor 106A and a lower conductor 106. The upper conductor 106A and lower conductor 106B act as electrical ground planes.

Figure 2A:
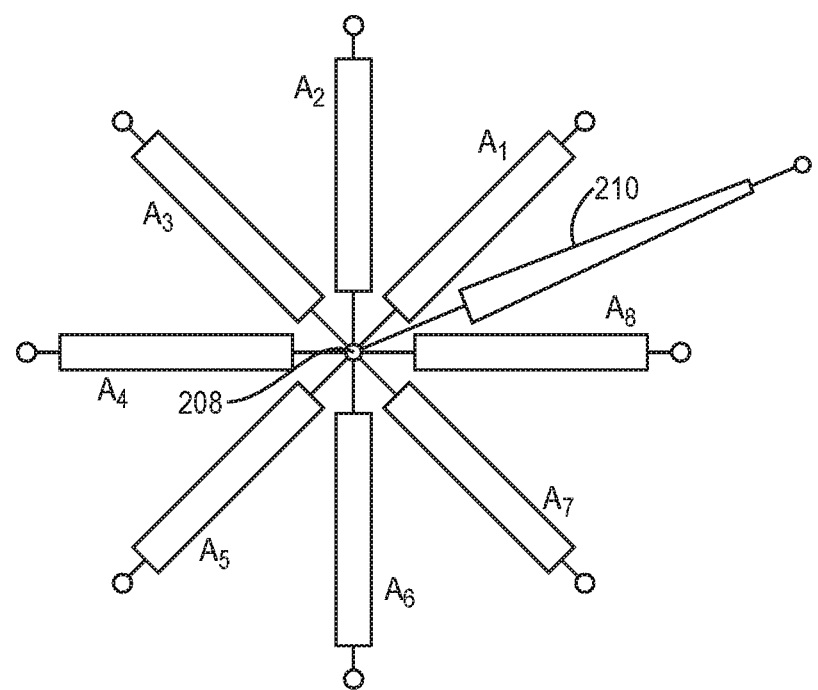
FIG. 2A illustrates a schematic representation of one embodiment of the stripline radial power combiner.
Figure 2B:
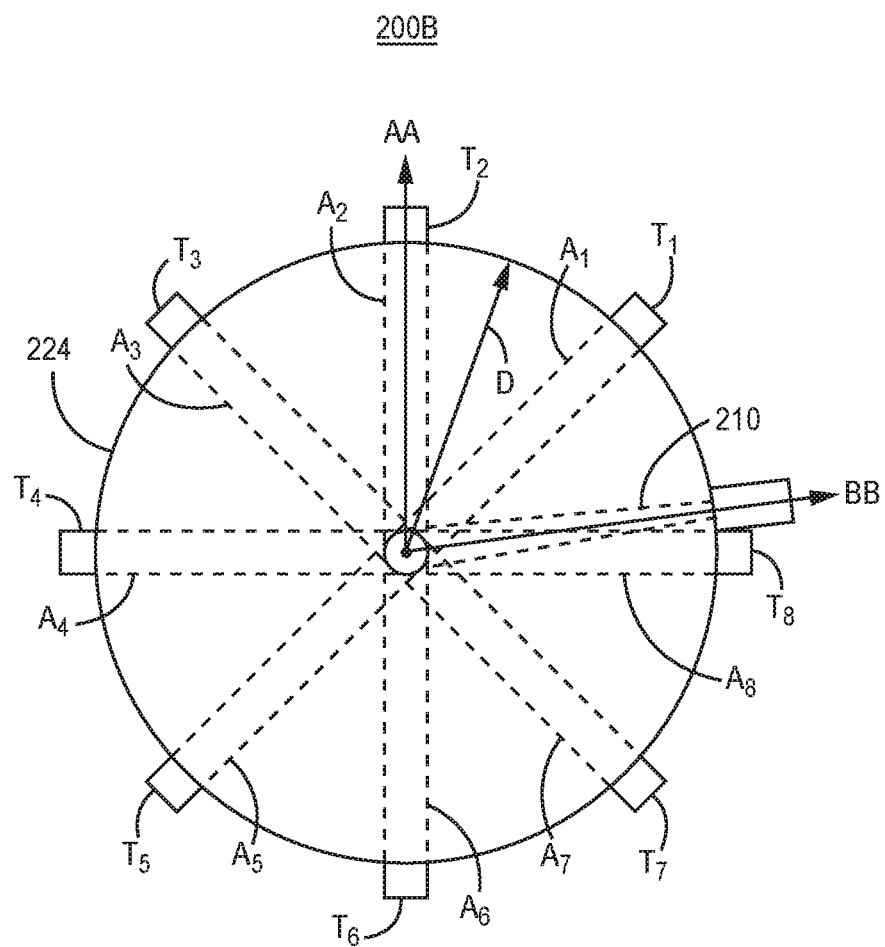
FIG. 2B illustrates a plan view of one embodiment of the stripline radial power combiner.

The stripline radial power combiner is formed by two levels of stripline; one stripline level is mounted over the other stripline level. FIG. 2A illustrates a schematic representation of one embodiment of the stripline radial power combiner 200A. A common port 210 is coupled through a common node 208, to eight radial arms $A_{1-8}$. FIG. 2B illustrates a plan view of one embodiment of the stripline radial power combiner 200B. Because FIG. 2B is a plan view, however, the two levels of stripline are not visible. However, a top ground plane 224, the radial arms $A_{1-8}$, and the corresponding output tabs $T_{1-8}$ are illustrated.

The common port 210 is a transmission line transformer. The length of the common port 210 establishes the diameter D of the stripline radial power combiner 200B. Each edge of the common port 210 illustrated in FIG. 2B has a linear taper which results in impedance transformation. However, each edge may have a non-linear taper, such as an elliptical taper (e.g. the common port may have a Klopfenstein taper). A common port 210 with a non-linear tapered edges, such as the Klopfenstein taper, provides a shorter length of the common port 210 (for a given return loss) then a common port 210 with a linear taper.

Additionally, the common port 210 illustrated in FIG. 2B has a linear center line from input to output (illustrated by reference line BB). However, if the center line of the common port 210 is curved, then diameter D can be further reduced. If the bend radius of the common port 210 increases when the width of the common port decreases, like with a Fibonnaci spiral (or modification thereof), then the bent common port will desirably have a behavior closer to a linear, or non-curved, common port.

Figure 2C:
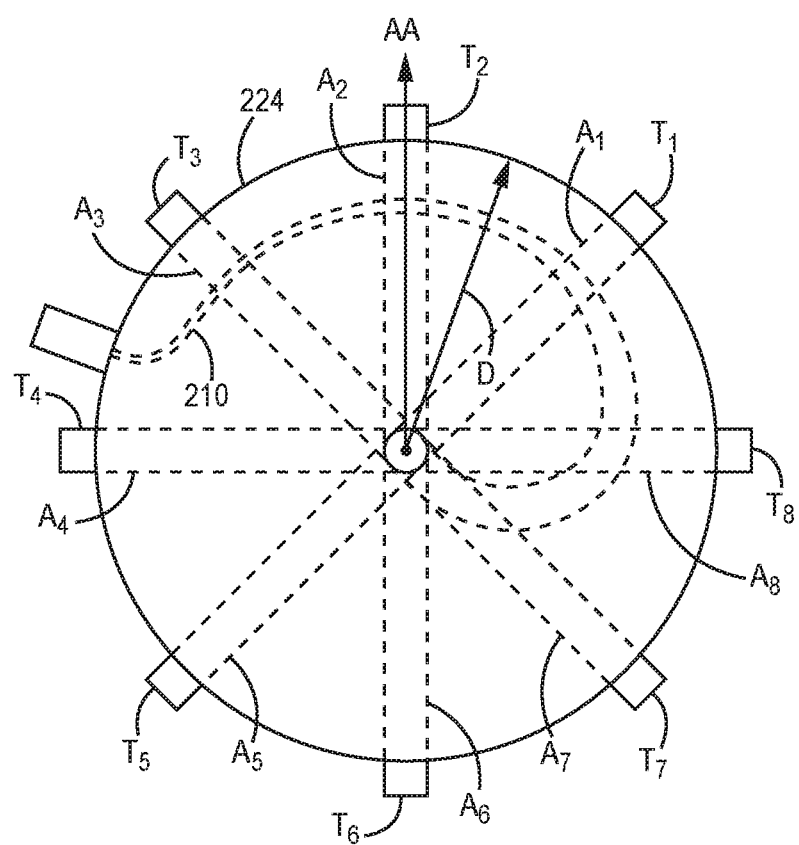
FIG. 2C illustrates a plan view of another embodiment of the stripline radial power combiner.

The non-linear taper, e.g. the Klopfenstein taper, can be combined with curved common port, e.g. implemented with a Fibonnaci spiral (or modification thereof). FIG. 2C illustrates a plan view of another embodiment of the stripline radial power combiner 200C. The stripline radial power combiner 200C includes a common port 210 that has non-linear tapered edges (i.e. a Klopfenstein taper) and is curved (i.e. a modified Fibonnaci spiral).

Figure 6A:
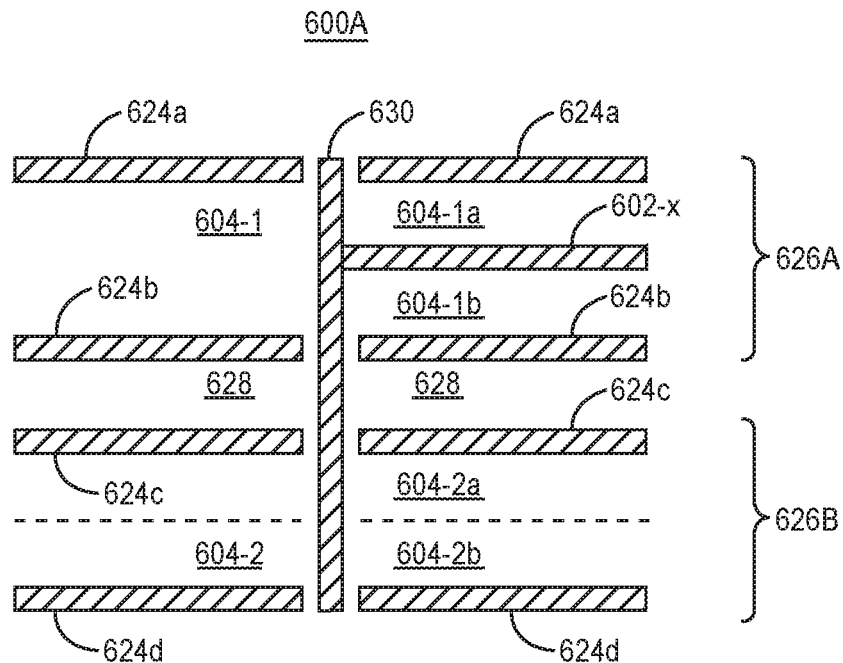
FIG. 6A illustrates a cross-section of one embodiment of a stripline radial power combiner.
Figure 6B:
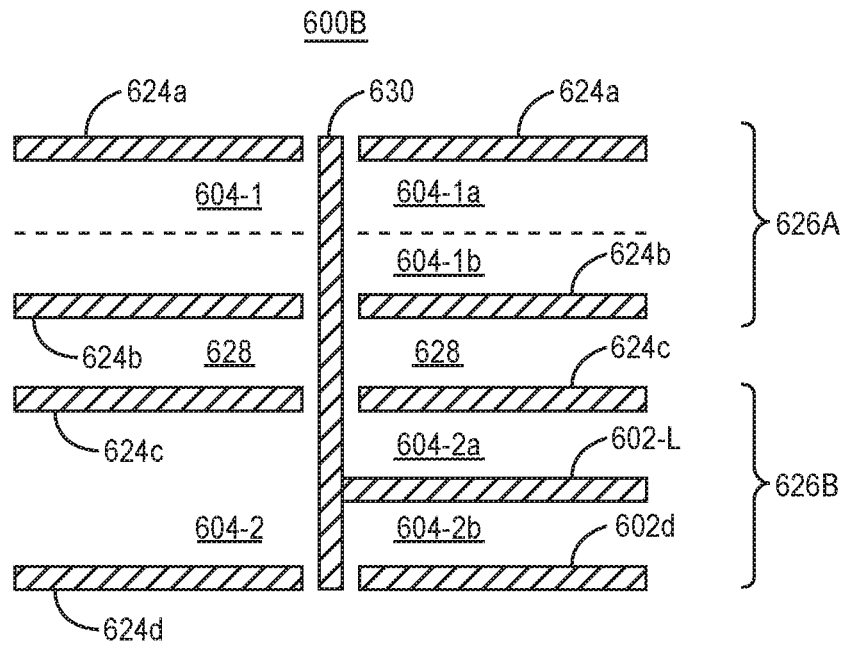
FIG. 6B illustrates another cross-section of one embodiment of a stripline radial power combiner.

FIG. 6A illustrates a cross-section of one embodiment of a stripline radial power combiner 600A. FIG. 6B illustrates another cross-section of one embodiment of a stripline radial power combiner 600B. FIGS. 6A and 6B illustrate cross sections along respectively reference lines AA and BB shown in FIG. 2B. The first stripline level 626A and the second stripline level 626B are illustrated in the cross-sections.

As illustrated in FIGS. 6A and 6B, a large surface, i.e. a ground plane, of one stripline level is mounted proximate (e.g. above or below) to a large surface, i.e. a ground plane, of the other stripline level. A first stripline level comprises N radial combiner arms connected (or coupled) at a center, or a first common node. A second stripline level comprises a common port connected (or coupled) to a second common node. In another embodiment, the first common node and the second common node are coupled by a conductive via.

Returning to the schematic illustrated in FIG. 2A, the illustrated stripline radial power combiner 200A has N arms $A_1$-$A_N$ where N equals eight. Each radial arm $A_x$ is coupled to a common node 208. A radial arm $A_x$ projects from a common node 208 radially away from the common node. In another embodiment, the common node 208 is in the center of the planes of the transmission lines of the stripline radial power combiner. The illustrated power combiner also includes a common port 210 coupled to the common node 208. In a further embodiment, the common node 208 comprises the first common node, the second common node, and the conductive via.

In one embodiment, each radial arm $A_x$ is a transmission line having a constant impedance, $Z_0$, along its length. In another embodiment, $Z_0$ equals fifty ohms. Thus, the impedance at the common node 208 is a lower impedance, $Z_0/N$. As discussed above, the common port 210 is a transmission line transformer. The common port 210 has an input impedance (provided externally of the stripline radial power combiner 200A) of $Z_0$. However, the output impedance, where the common port 210 is connected to the common node 208 is a lower impedance, $Z_0/N$, to match the impedance of the parallel radial arms $A_1$-$A_N$.

Although this embodiment will be subsequently exemplified for pedagogical purposes, the stripline radial power combiner 200 can be implemented with each radial arm $A_x$ being implemented as a transmission line transformer, i.e. with a center conductor having varying width along its length. Correspondingly, the common port 210 being implement as a transmission line with a center conductor having a constant width along its length, or as a transmission line transformer with the center conductor having a varying width along its length. For example, each radial arm can be a transmission line transformer having an input impedance (provided externally of the stripline radial power combiner 200) of $Z_0$, and an output impedance, where each arm $A_x$ is to be connected to the common node 208, of $N*Z_0$. Thus, the impedance of the outputs of the arms $A_{1-N}$ connected in parallel, at the common node 208, is $Z_0$. As a result, the common port 210 can be implemented with a transmission line having an impedance of $Z_0$ along its length.

Figure 3:
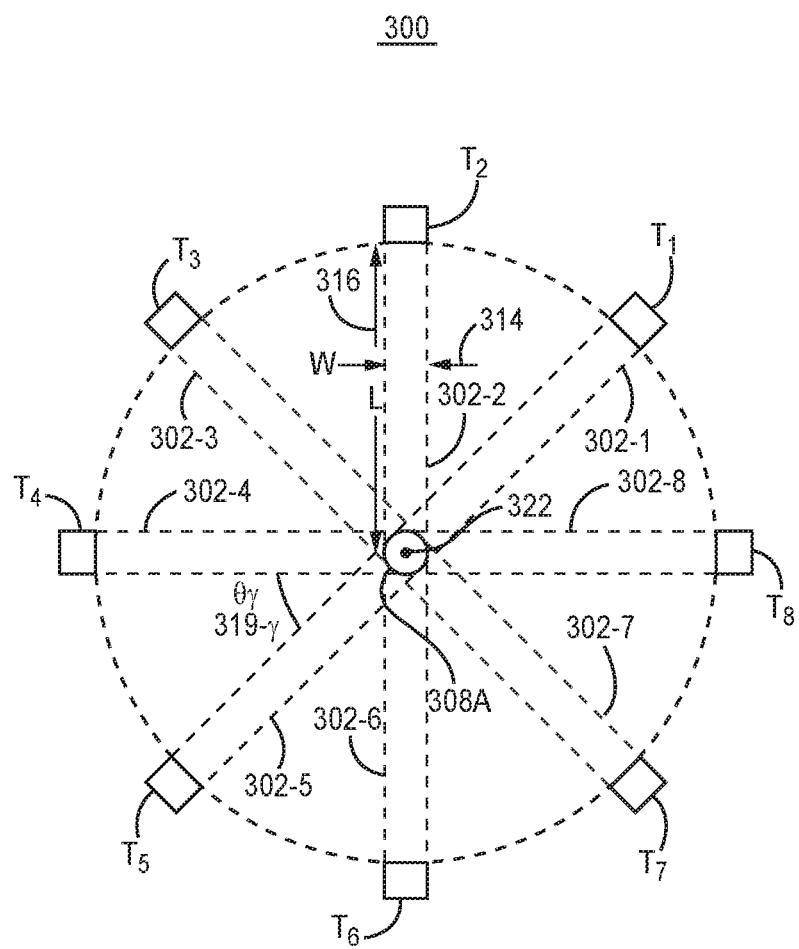
FIG. 3 illustrates a plan view of one embodiment of center conductors for eight radial combiner arms connected at a first common node.

FIG. 3 illustrates one embodiment of a plan view of the center conductors for eight radial combiner arms connected at a first common node 300. In another embodiment, each radial arm $A_x$ is transmission line having a center conductor 302-$x$ with a width (W) 314 that is constant over the length (L) 316 of the corresponding center conductor 302-$x$. Each transmission line has a characteristic impedance, $Z_0$, based upon the dielectric constant and thickness of the dielectric above and below the center conductor 302-$x$, the width (W) 314 of the center conductor 302-$x$ and the thickness of the center conductor 302-$x$. When the characteristic impedances of each transmission line are the same, the characteristic impedance at the first common node 308A (or the juncture of the center conductors 302-$x$ of each radial arm $A_x$) is $Z_0/N$. In a further embodiment, the electrical length of the transmission line is equal. A via hole 322 is formed in the first common node 308A. The diameter of the first common node 308A may be other than shown to facilitate impedance matching, e.g. of the radial arms and the first common node 308A.

In one embodiment, each pair of adjacent transmission lines is separated by an angle ($\Theta_y$) 319-y equal to three hundred and sixty degrees/N, where N is the number of radial arms. Alternatively, in another embodiment, at least two pairs of adjacent transmission lines are separated by different angles, e.g. based upon the number of stacked stripline radial power combiners.

In the illustrated embodiment, the periphery 318 of the first strip line level defines the periphery of the ground planes and dielectric. The periphery 318 of the first stripline level and the second stripline level are typically circular, e.g. if the lengths of the radial arms and the common port are equal length. However, other peripheral shapes could be used.

In the illustrated embodiment, output tabs $T_x$ are extensions of the center conductors 302-$x$ forming each radial arm $A_x$. In another embodiment, the output tabs $T_x$ extend beyond the dielectric and the periphery 318, and facilitate connections to external circuitry, e.g. microstrip transmission lines on a printed circuit board (PCB) or components mounted on the PCB, e.g. to which the stripline radial power combiner 200 is mounted. The connections can be facilitated, e.g. by one or more parallel ribbon bonds connecting an output tab to the external circuitry, such as a microstrip transmission line on the PCB or a bond pad on a component mounted on the PCB.

Figure 4:
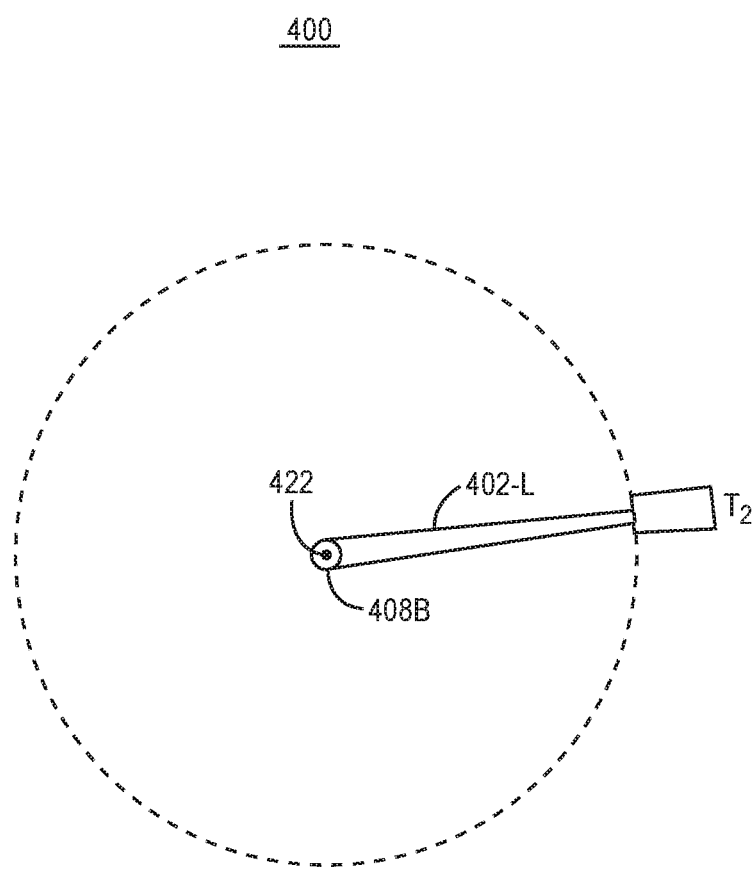
FIG. 4 illustrates a plan view of one embodiment of a center conductor of a common port connected to the second common node.

The second stripline level comprises the common port 210 and a second common node. FIG. 4 illustrates one embodiment of a plan view of a center conductor of the common port connected to the second common node 400. In another embodiment, the common port 210 is formed by a transmission line with a center conductor 402-L having a width that varies from a width corresponding to a characteristic impedance, $Z_0$, to a broader width that corresponds to $Z_0/N$. The broader width end of the center conductor 402-L, corresponding to impedance $Z_0/N$, is coupled to the second common node 408B. The narrower width end, corresponding to impedance $Z_0$ is connected output tab $T_L$ which is an extension of the center conductors 402-L. The output tab $T_L$ facilitates connection to external circuitry as exemplified above. A via hole 422 is formed in the second common node 408B.

The transmission line of the common port 210 acts as a transformer, transforming impedance $Z_0$ to impedance $Z_0/N$. In a further embodiment, the transmission line transformer of the common port 210 has an electrical length substantially similar to the electrical length of the transmission line of each radial arm $A_x$.

FIGS. 2A and 4 respectively illustrate the common port 210 and the corresponding center conductor 402-L being tapered for their full length. However, depending upon operating frequency, the taper may only be a portion of the length of the common port 210 and the corresponding center conductor 402-L. Thus, in one embodiment, the common port 210 and the corresponding center conductor 402-L include a tapered portion and at least one constant width portion. The tapered portion is an impedance transformer, and the constant width portion(s) each have a constant impedance, e.g. equivalent to the impedance at the end of the tapered portion to which it is respectively attached.

In an alternative embodiment, in the first stripline level, each radial arm $A_x$ is a transmission line transformer tapering from a broad width, corresponding to an external characteristic impedance of $Z_0$, to a narrower width corresponding to an impedance $Z_C$. Thus, the impedance at the center is $Z_C/N$. The common port 210 is a transmission line which may be a transformer depending upon the value of $Z_C$. If $Z_C$ is equal to $Z_0$, then the common port 210 is a transmission line having a fixed width and an impedance of $Z_0$.

Figure 5:
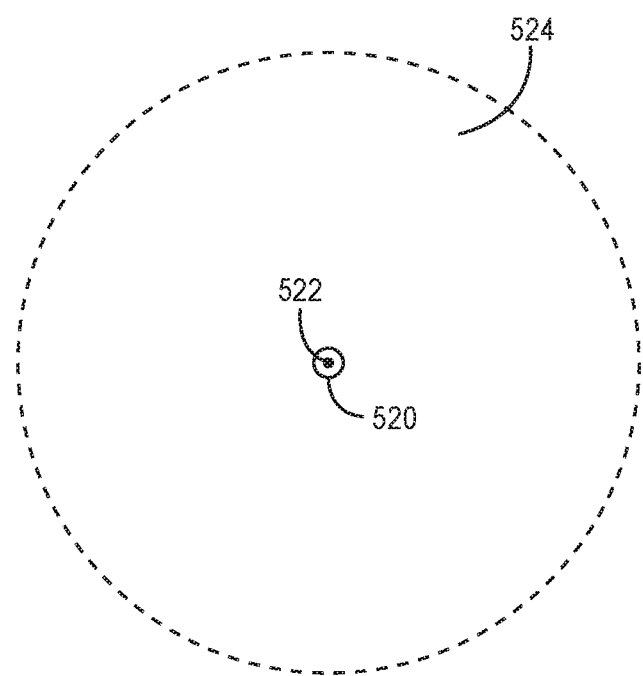
FIG. 5 illustrates a plan view of one embodiment of an exemplary ground plane of first and second stripline levels.

FIG. 5 illustrates one embodiment of an exemplary ground plane of the first and second stripline levels 500. To isolate the via hole from the ground plane, an annular portion, or alternatively another shaped portion of conductor 524 is removed at the center of the ground plane. A via hold 522 is formed in the annular region 520 of dielectric for reasons that will be subsequently described.

Returning to FIG. 6A, the cross-section illustrates a cross-section of an exemplary center conductor 602-$x$ of a radial arm $A_x$ in the first stripline level 626A. The first stripline level 626A comprises three conductor layers: a first ground plane 624a, a radial arm conductor layer (as illustrated by the exemplary center conductor 602-$x$), and a second ground plane 624b. In another embodiment, the conductors, including those that form the ground planes, described herein are formed with gold or copper. The radial arm conductor layer is separated from the first ground plane 624a and the second ground plane 624b by a first level dielectric 604-1, i.e. respectively by a top half of the first level dielectric 604-1a and a bottom half of the first level dielectric 604-1a. In a further embodiment, the dielectric can be a dielectric substrate such as Roger Corporation's Duroid® or air.

The second stripline level 626B is formed in a manner analogous to the first stripline level 626A. The second stripline level 626B comprises three conductor layers: a third ground plane 624c, a common node conductor layer (not shown), and a fourth ground plane 624d. The common node conductor layer is separated from the third ground plane 624c and the fourth ground plane 624d by a second level dielectric 604-2, i.e. respectively by a top half of the second level dielectric 604-2a and a bottom half of the second level dielectric 604-2a. The first ground plane 624a and the fourth ground plane 624d are also referred to herein as exterior ground planes as they cover exterior sides of the stripline radial power combiner 600A.

The second stripline level 626B is mounted below the first stripline level 626A. A via (conductive via) 630 is formed by filling via holes (through the center of the ground planes, conductor layers, and dielectric layers) with a conductor; the via 630 electrically connects the common port 210 with each radial arm $A_x$.

In one embodiment, as illustrated in FIG. 6A, the second stripline level 626B is isolated from the first stripline level 626A by an intermediary dielectric layer 628. The enhanced separation between the first stripline level 626A and the second stripline level 626B reduces undesirable electromagnetic coupling between the common port 210 and any proximate radial arm. The via 630 passes through the intermediary dielectric layer 628. However, the increased separation also increases the length of the via 630, and thus the inductance between the common port 210 and each radial arm $A_x$. Increased inductance is undesirable at higher frequencies. Therefore, in another embodiment, no intermediary dielectric 628 is used in the stripline radial power combiner 600A.

Returning to FIG. 6B, the cross-section illustrates a cross-section of the common port 210, formed in part by common port conductor layer 602L, in the second stripline level 626B.

Because the stripline radial power combiner has flat surfaces, i.e. including the first ground plane 624a and the fourth ground plane 624d, M stripline radial power combiners can be stacked upon one another to make a stripline radial power combiner system, where M is an integer greater than one. M stripline radial power combiners can be used to provide power combining for N M port devices to implement complex systems. N is the number of components coupled to the stripline radial power combiner system, and is the number of arms in each stripline radial power combiner. M is the number of ports in each component and the number of stacked stripline radial power combiners in the stripline radial power combiner system.

Figure 7:
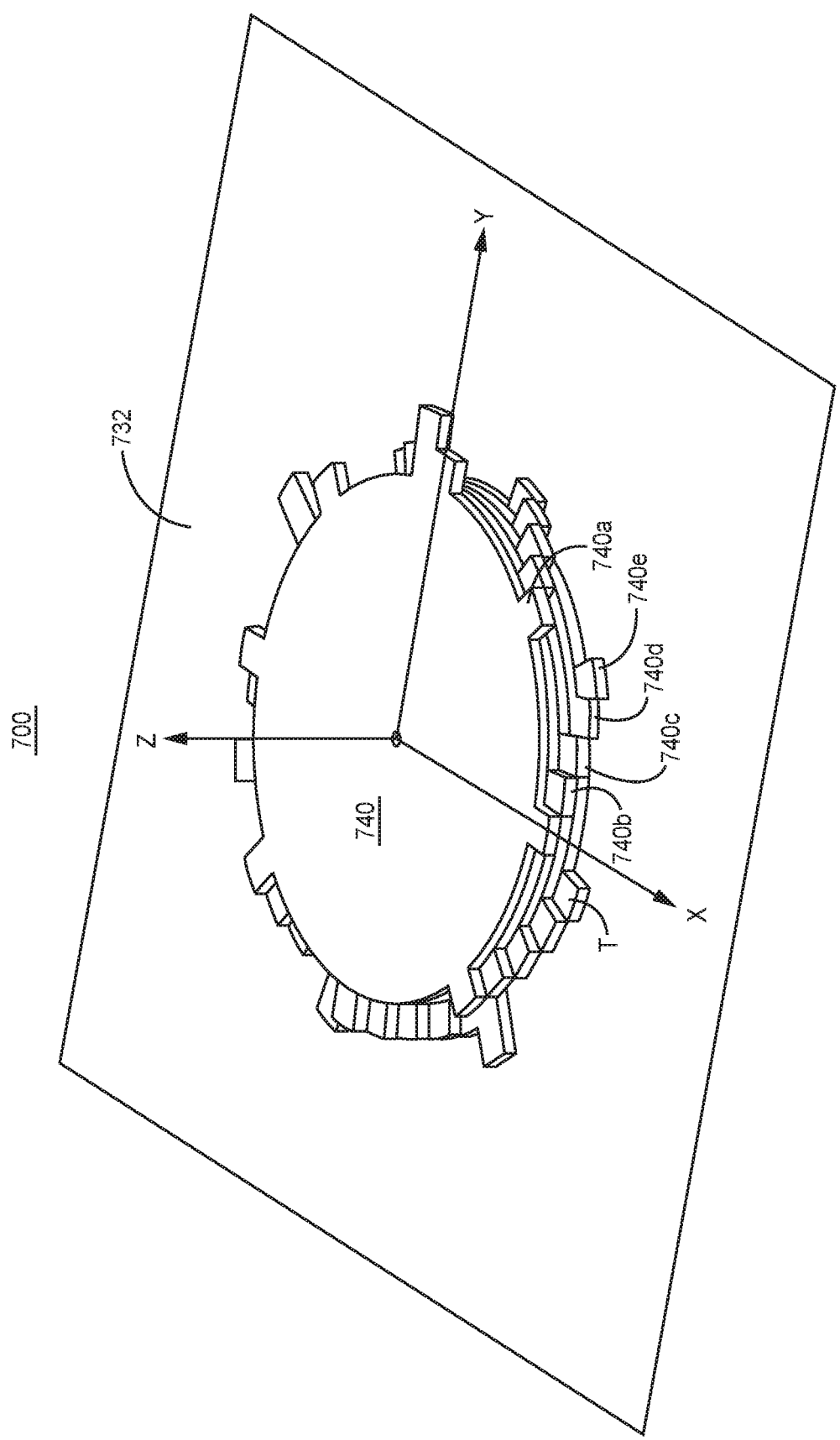
FIG. 7 illustrates one embodiment of a stripline radial power combiner system comprising five stacked eight port stripline radial power combiners.

FIG. 7 illustrates one embodiment of a stripline radial power combiner system comprising five stacked eight port stripline radial power combiners mounted on a printed circuit board 700. In this embodiment, M equals five and N equals eight. For each pair of stripline power combiners in the stripline power combiner system 740, the first or second stripline level of one stripline radial power combiner may be stacked above, or mounted to, the first or second stripline level of a second stripline radial power combiner.

In the illustrated embodiment, the stripline radial power combiner system 740 is mounted to a printed circuit board 732. In another embodiment, the exterior ground planes of stripline radial power combiners 740a-e are attached to one another with a non-conductive adhesive such as non-conductive epoxy to avoid short circuiting the vias 630 of each stripline radial power combiner. In a further embodiment, the stripline radial power combiner system 700 is also attached to the printed circuit board 732 by an adhesive which can be conductive, such as conductive epoxy, to ensure a connection of at least one ground plane to ground.

The output tabs $T_{x,y}$ (where x is indicative of the radial arm, and y is indicative of the stripline radial power combiner 740y) of each arm $A_{x,y}$ of a stripline radial power combiner is offset, staggered, from output tabs of arms of the stripline radial power combiners just above and below. The staggering permits each output tab to be coupled, e.g. to the PCB upon which the stripline radial power combiner system is mounted, or to other component(s), e.g. mounted on the PCB. In one embodiment, one or more parallel bond ribbons are used to connect each output tab to terminals, or pads, on the printed circuit board or such component(s).

Figure 8A:
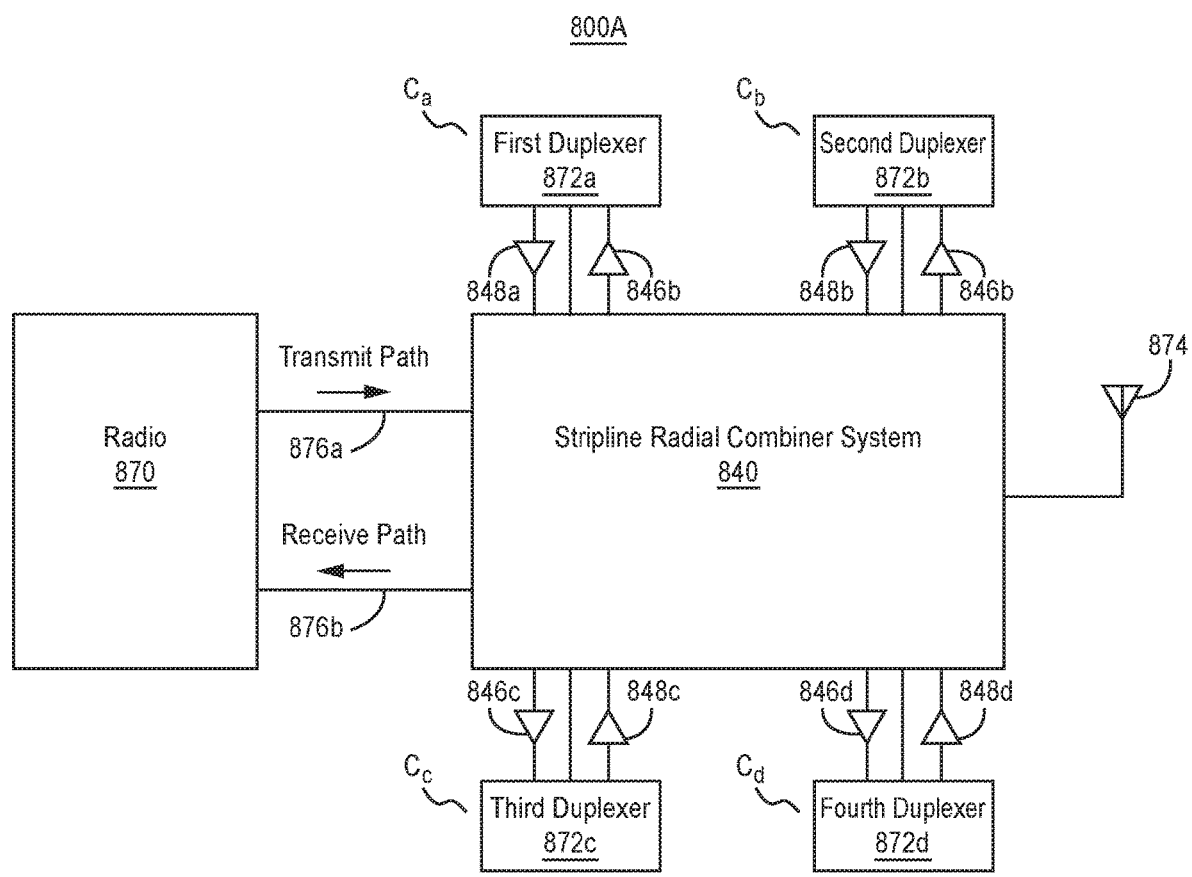
FIG. 8A illustrates a block diagram of one embodiment of a radio system incorporating a stripline radial power combiner system.

FIG. 8A illustrates a block diagram of one embodiment of a radio system incorporating a stripline radial power combiner system 800A. In another embodiment, the radio system 800A is part of a eNodeB small cell or a remote radio unit of a distributed antenna system. The illustrated radio system 800A has a transmit path 876a and a receive path 876b respectively coupled to a transmitter and receiver in the radio 870. The illustrated stripline radial combiner system 840 of the radio system 800A comprises four stripline radial combiners, each having six ports. Thus, M equals four and N equals six. However, in alternative embodiments of a radio system, M can be as small as two, e.g. if only two pairs of duplexers, power amplifiers, and low noise amplifiers are utilized. By combining two or more pairs of power amplifiers, lower power output power amplifiers (such as those developed for cell phones) can be used, with resulting lower additive phase noise. N, however, can be greater, if a multiplexer such as a quadplexer is used to combine two or more sets of amplifiers coupled to a multiplexer; such an embodiment is subsequently exemplified. The duplexer and multiplexers discussed herein may be formed by thin-film bulk acoustic resonators or ceramic resonators.

The radio system 800A includes a stripline radial combiner system 840 coupled to a radio 870, an antenna 874, a first duplexer 872a, a second duplexer 872b, a third duplexer 872c, a fourth duplexer 872d, a first power amplifier 846a, a second power amplifier 846b, a third power amplifier 846c, a fourth power amplifier 846d, a first low noise amplifier 848a, a second low noise amplifier 848b, a third low noise amplifier 848c, and a fourth low noise amplifier 848d. Each power amplifier 846x and low noise amplifier 848x are respectively and uniquely coupled to two ports of a corresponding duplexer 872x. The stripline radial combiner system 840 couples:

(a) the antenna 874 to common ports of each duplexer 872x;
(b) an input of each power amplifier 846x to the transmit path 876a; and
(c) an output of each low noise amplifier 848x to the receive path 876b.

Each set of duplexer 872x, power amplifier 846x, and low noise amplifier 848x forms a component $C_x$.

Figure 8B:
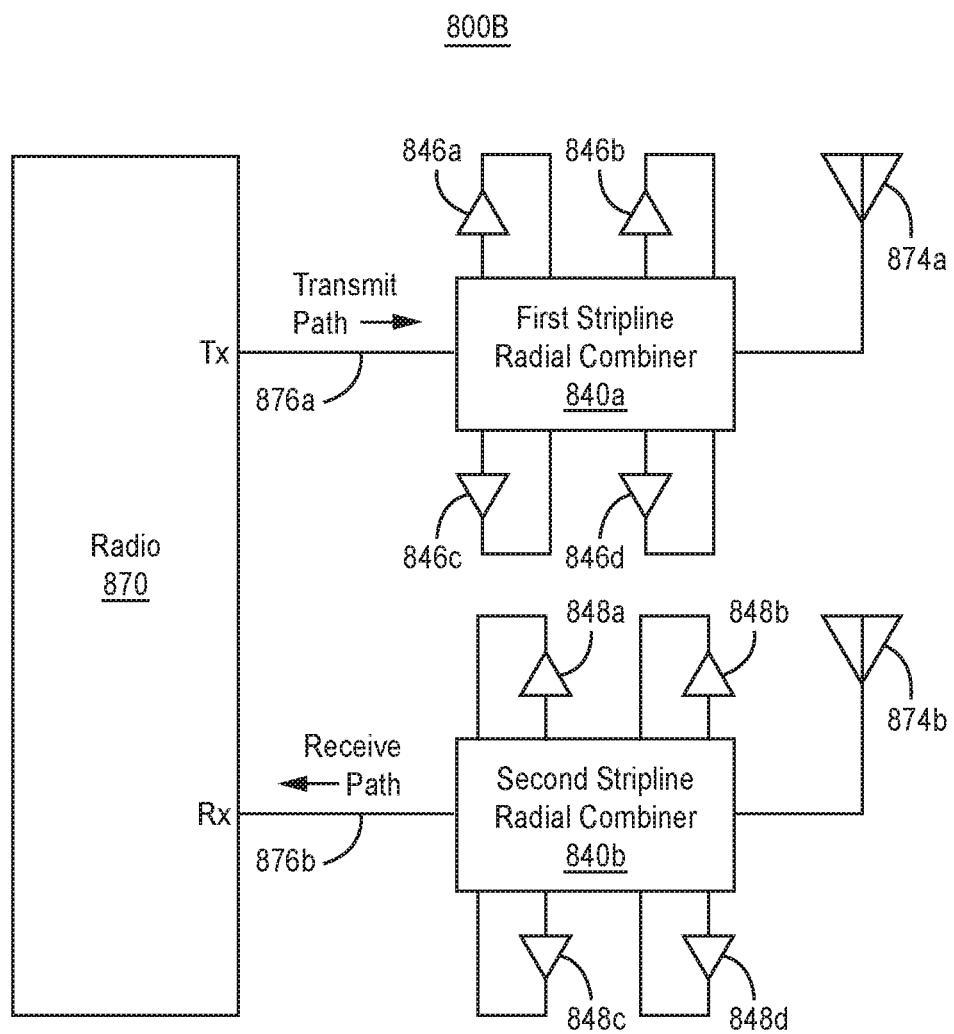
FIG. 8B illustrates a block diagram of an embodiment of a radio system incorporating stripline radial power combiner systems 800B.

FIG. 8B illustrates a block diagram of an embodiment of a radio system incorporating stripline radial power combiner systems 800B. The radio system incorporating stripline radial power combiner systems 800B is similar to the radio system illustrated in FIG. 8A, except that the transmit path 876a and the receive path 876b are respectively coupled to a first port of a first stripline radial power combiner systems 840a and to a first port of a second stripline radial power combiner system 840b. Further, a transmit antenna 874a and a receive antenna 874b are respectively coupled to a second port of the first stripline radial power combiner systems 840a and to a second port of the second stripline radial power combiner system 840b.

At least two power amplifiers and at least two low noise amplifiers are respectively coupled to corresponding ports of the stripline radial power combiner systems 840a and a second stripline radial power combiner system 840b. FIG. 8B illustrates four power amplifiers coupled to the first stripline radial combiner system 840b, and four low noise amplifiers coupled to the second stripline radial combiner system 840b.

The transmitter in the radio 870 is thus coupled to the power amplifiers coupled to the first stripline radial power combiner 840a. If the power amplifiers are the same, then by coupling two or more power amplifiers to the first stripline radial power combiner 840a, the output power delivered to the transmit antenna 874a is increased, without undesirably, substantially increasing the distortion in the output of the combined power amplifiers. For example, the gain of the combined power amplifiers can be increased (by adding more power amplifiers) without substantially increasing such distortion, e.g. as measured by a compression point, e.g. 1 dB compression point, of the combined power amplifiers.

The receiver in the radio 870 is thus coupled to the low noise amplifiers coupled to the second stripline radial power combiner 840b. If the low noise amplifiers are the same, then by coupling two or more low noise amplifiers to the second stripline radial power combiner 840b, the gain of the combined low noise amplifiers can be increased without undesirably, substantially increasing the intermodulation distortion of the low noise amplifier. For example, the gain of the combined low noise amplifiers can be increased (by adding more low noise amplifiers) without substantially increasing such intermodulation distortion, e.g. as measured by an intermodulation product such as the third order intermodulation product. Thus, the noise figure of the combined low noise amplifiers and the receiver can be decreased without substantially increasing intermodulation distortion.

Figure 8C:
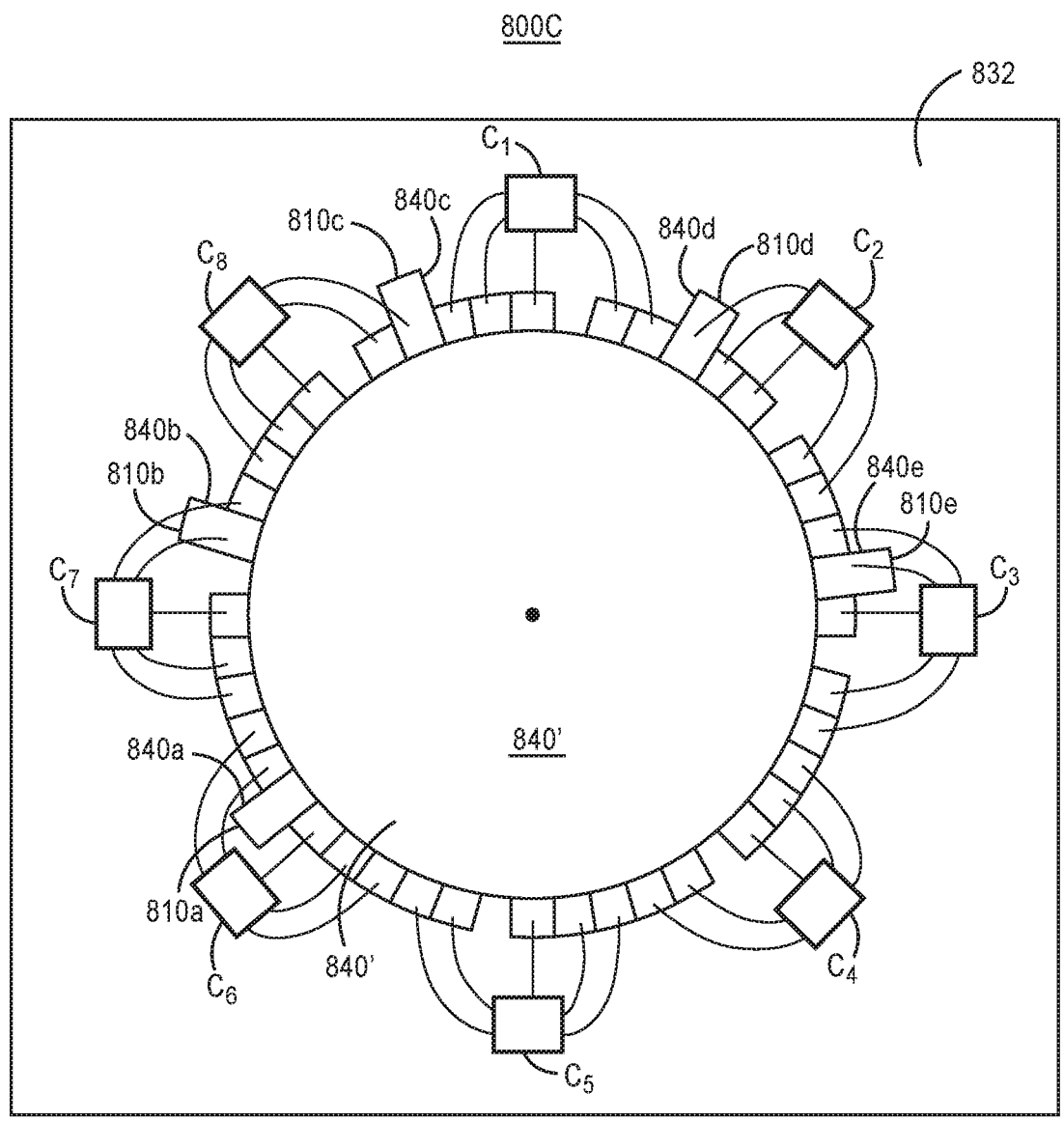
FIG. 8C illustrates one embodiment of eight five port components coupled to a stripline radial power combiner system mounted on a printed circuit board.

FIG. 8C illustrates one embodiment of eight five port components coupled to a stripline radial power combiner system mounted on a printed circuit board 800B. In one embodiment, one or more of the eight five port components are mounted on the printed circuit board 800B, and by or under corresponding output tabs of the stripline radial power combiner system 840'. The illustrated stripline radial power combiner system 840' comprises five stacked eight port stripline radial power combiners 840x. Each port of each component $C_x$ is coupled to an output tab $T_{x,y}$ of a different stripline radial power combiner 840x. Each stripline radial power combiner 800x has a common port 810x.

Figure 9:
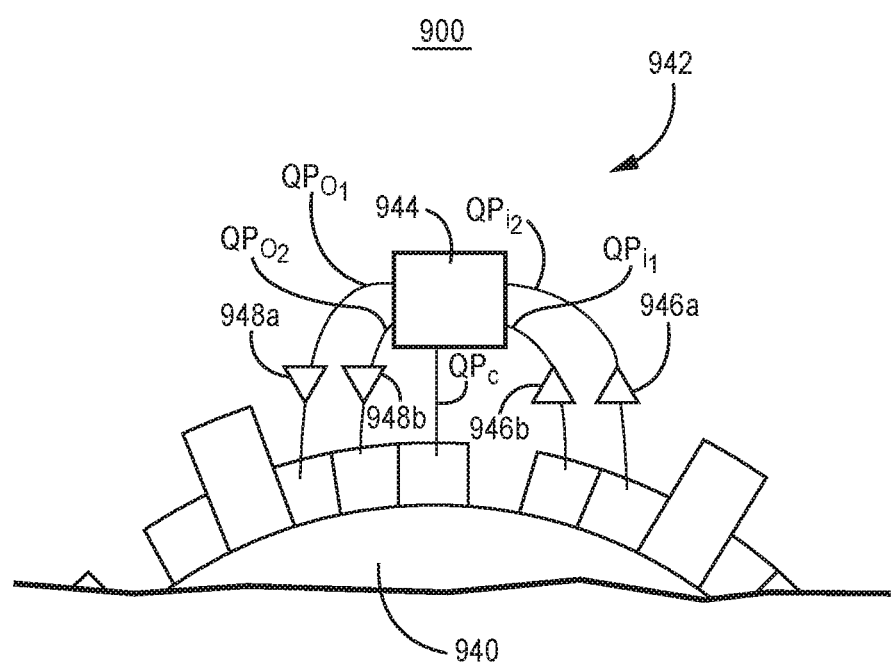
FIG. 9 illustrates one component that is a transceiver front end coupled to an output tabs of a stripline radial power combiner system.

FIG. 9 illustrates one component that is a transceiver front end coupled to an output tabs $T_{x,y}$ of a stripline radial power combiner system 900. In the illustrated embodiment, the transceiver front end 942 comprises a quadplexer 944 having a common port $QP_c$, a first input port $QP_{i1}$, a second input port $QP_{i2}$, a first output port $QP_{o1}$, and a second output port $QP_{o2}$. A first power amplifier 946a and a second power amplifier 946b have inputs respectively coupled to the first input port $QP_{i1}$ and the second input port $QP_{i2}$. A first low noise amplifier 948a and a second low noise amplifiers 948b have inputs respectively coupled to the first output port $QP_{o1}$ and the second output port $QP_{o2}$. The inputs of the first power amplifier and the second power amplifier, the outputs of the first low noise amplifier and the second low noise amplifier, and the common port are respectively coupled to adjacent output tabs $T_{x,y}$ of a different stripline radial power combiner of the stripline radial power combiner system 940.

Figure 10:
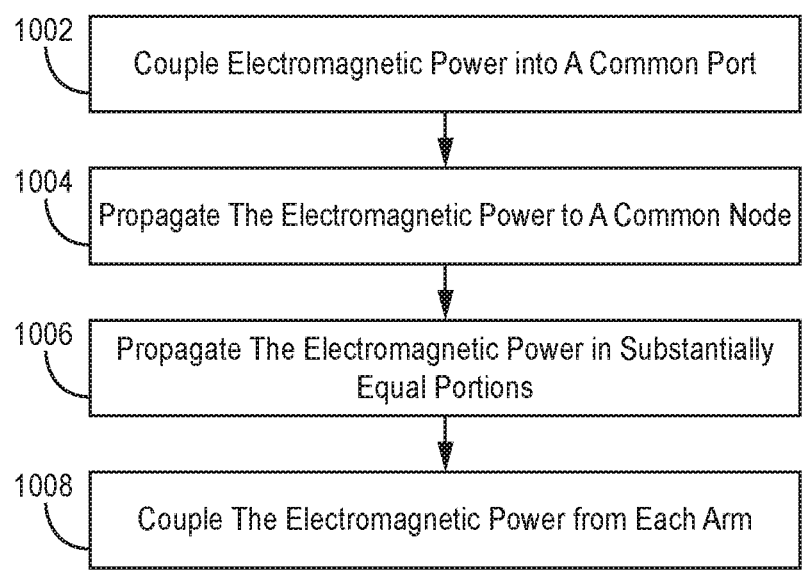
FIG. 10 illustrates one embodiment of a method of operation of a stripline radial power combiner.

FIG. 10 illustrates one embodiment of a method of operation of a stripline radial power combiner 1000. To the extent that the embodiment of method 1000 shown in FIG. 10 is described herein as being implemented in the systems shown in FIGS. 1 through 9, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In one embodiment, in block 1002, couple electromagnetic power into a common port of a stripline radial power combiner. In another embodiment, coupling the electromagnetic power into the common port of the stripline radial power combiner comprises coupling, from a common tab connected to the common port, the electromagnetic power into the common port of the stripline radial power combiner.

In block 1004, propagate the electromagnetic power to a common node of the stripline radial power combiner. In one embodiment, propagating the electromagnetic power to the common node of the stripline radial power combiner comprises propagating the electromagnetic power to a first common node, and propagating the electromagnetic power from the first common node to a second common node.

In block 1006, propagate, in substantially equal proportions in N radial arms, the electromagnetic power received at the common node. In one embodiment, propagating, in substantially equal proportions in the N radial arms, the electromagnetic power received at the common node comprises propagating, in substantially equal proportions in the N radial arms, the electromagnetic power received at the second common node.

In one embodiment, in block 1008, couple the substantially equal proportions electromagnetic power from each N radial arm out of the stripline radial power combiner, e.g. to a component. In another embodiment, coupling the substantially equal proportions of electromagnetic power from each N radial arm out of the stripline radial power combiner comprises coupling the substantially equal proportions of electromagnetic power from N output tabs each of which is uniquely connected to each of the N radial arms.

Figure 11:
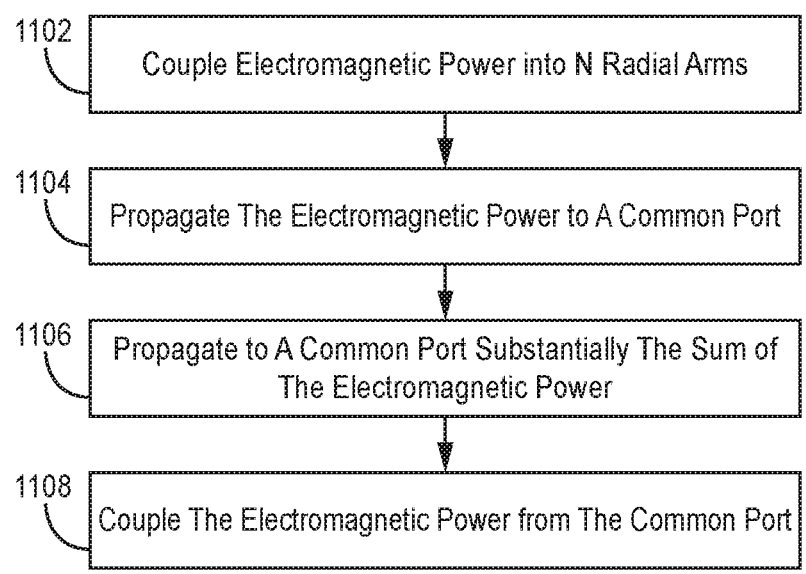
FIG. 11 illustrates another embodiment of a method of operation of a stripline radial power combiner.

FIG. 11 illustrates another embodiment of a method of operation of a stripline radial power combiner 1100. To the extent that the embodiment of method 1100 shown in FIG. 11 is described herein as being implemented in the systems shown in FIGS. 1 through 9, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In one embodiment, in block 1102, couple electromagnetic power into N radial arms of a stripline radial power combiner. In another embodiment, coupling the electromagnetic power into the N radial arms of a stripline radial power combiner comprises coupling, from N output tabs each of which is uniquely connected to each of the N radial arms, the electromagnetic power into the N radial arms of the stripline radial power combiner.

In block 1104, propagate the electromagnetic power to a common node of the stripline radial power combiner. In one embodiment, propagating the electromagnetic power to the common node of the stripline radial power combiner comprises propagating the electromagnetic power to a first common node, and propagating the electromagnetic power from the first common node to a second common node.

In block 1106, propagate, to a common port, substantially the combination, or sum, of the electromagnetic powers in N radial arms received from the common node. In one embodiment, propagating, to the common port, substantially the combination, or sum, of the electromagnetic power in N radial arms received from the common node comprises propagating substantially the combination, or sum, of the electromagnetic power in N radial arms received from the second common node.

In one embodiment, in block 1108, couple the combined electromagnetic power from the common port, e.g. to a component. In one embodiment, coupling the electromagnetic power from the common port comprises coupling the electromagnetic power from an output tab connected to the common port.

EXAMPLE EMBODIMENTS

Example 1 includes a stripline radial power combiner, comprising: a first stripline level comprising N radial combiner arms coupled to a first common node; a second stripline level comprising a common port coupled to a second common node; wherein the first stripline level is mounted over the second stripline level; and wherein the first common node and the second common node are coupled by a conductive via through the first stripline level and the second stripline level.

Example 2 includes the stripline radial power combiner of Example 1, wherein each edge of the common port has a non-linear taper.

Example 3 includes the stripline radial power combiner of Example 2, wherein the edges of the common port have a Klopfenstein taper.

Example 4 includes the stripline radial power combiner of any of Examples 1-3, wherein the common port is curved.

Example 5 includes the stripline radial power combiner of Example 4, wherein the curve of the common port is a modified Fibonacci spiral.

Example 6 includes the stripline radial power combiner of any of Examples 1-5, wherein each pair of adjacent radial arms are separated by an angle equal to three hundred and sixty degrees divided by N.

Example 7 includes the stripline radial power combiner of any of Examples 1-6, further comprising an intermediary dielectric layer separating the first stripline level and the second stripline level; and wherein the conductive via passes through the intermediary dielectric layer.

Example 8 includes a stripline radial power combiner system, comprising: a first stripline radial power combiner, comprising: a first stripline level comprising a first set of N first radial combiner arms coupled to a first common node; a second stripline level comprising a first common port coupled to a second common node; and wherein the first common node and the second common node are coupled by a first conductive via through the first stripline level and the second stripline level; a second stripline radial power combiner, comprising: a third stripline level comprising a second set of N second radial combiner arms coupled to a third common node; and a fourth stripline level comprising a second common port coupled to a fourth common node; and wherein the third common node and the fourth common node are coupled by a second conductive via through the third stripline level and the fourth stripline level; wherein the first stripline level or the second stripline level is mounted over the third stripline level or the fourth stripline level.

Example 9 includes the stripline radial power combiner system of Example 8, wherein the first stripline level or the second stripline level is attached to the third stripline level or the fourth stripline level by a non-conductive adhesive; and wherein each pair of adjacent radial arms in the first set and each pair of adjacent radial arms in the second set are each separated by an angle equal to three hundred and sixty degrees divided by N.

Example 10 includes the stripline radial power combiner of any of Examples 8-9, wherein the first stripline radial power combiner further comprises a first intermediary dielectric layer separating the first stripline level and the second stripline level; wherein the first conductive via passes through the first intermediary dielectric layer; wherein the second stripline radial power combiner further comprises a second intermediary dielectric layer separating the third stripline level and the fourth stripline level; and wherein the second conductive via passes through the second intermediary dielectric layer.

Example 11 includes a system, comprising: a first stripline radial power combiner, comprising: a first stripline level comprising a first set of at least two radial combiner arms coupled to a first common node; a second stripline level comprising a first common port coupled to a second common node; and wherein the first common node and the second common node are coupled by a first conductive via through the first stripline level and the second stripline level; a second stripline radial power combiner, comprising: a third stripline level comprising a second set of at least two second radial combiner arms coupled to a third common node; and a fourth stripline level comprising a second common port coupled to a fourth common node; and wherein the third common node and the fourth common node are coupled by a second conductive via through the third stripline level and the fourth stripline level; a third stripline radial power combiner, comprising: a fifth stripline level comprising a third set of at least two radial combiner arms coupled to a fifth common node; a sixth stripline level comprising a third common port coupled to a sixth common node; and wherein the fifth common node and the sixth common node are coupled by a third conductive via through the fifth stripline level and the sixth stripline level; wherein the first stripline level or the second stripline level is mounted over the third stripline level or the fourth stripline level; wherein the third stripline level or the fourth stripline level is mounted over the fifth stripline level or the sixth stripline level; a first duplexer and a second duplexer coupled to unique radial combiner arms of the third set; a first power amplifier and a second power amplifier coupled to unique radial combiner arms of the second set; a first low noise amplifier and a second low noise amplifier coupled to unique radial combiner arms of the third set; wherein the first power amplifier and the second power amplifier are respectively coupled to the first duplexer and the second duplexer; and wherein the first low noise amplifier and the second low noise amplifier are respectively coupled to the first duplexer and the second duplexer.

Example 12 includes the system of Example 11, further comprising a radio coupled to the first common port and the second common port.

Example 13 includes the system of Example 12, further comprising an antenna coupled to the third common port.

Example 14 includes the system of any of Examples 11-13, wherein the first stripline level or the second stripline level is attached to the third stripline level or the fourth stripline level by a non-conductive adhesive; and wherein the third stripline level or the fourth stripline level is attached to the fifth stripline level or the sixth stripline level by a non-conductive adhesive.

Example 15 includes the system of any of Examples 11-14, wherein each pair of adjacent radial arms of the first set, each pair of adjacent radial arms of the second set, and each pair of adjacent radial arms of the third set are each separated by the same angle.

Example 16 includes the system of any of Examples 11-15, wherein the first stripline radial power combiner further comprises a first intermediary dielectric layer separating the first stripline level and the second stripline level; wherein the first conductive via passes through the intermediary dielectric layer; wherein the second stripline radial power combiner further comprises a second intermediary dielectric layer separating the third stripline level and the fourth stripline level; wherein the second conductive via passes through the second intermediary dielectric layer; wherein the third stripline radial power combiner further comprises a third intermediary dielectric layer separating the fifth stripline level and the sixth stripline level; and wherein the third conductive via passes through the third intermediary dielectric layer.

Example 17 includes the system of any of Examples 11-16, wherein each edge of each of the first common port, the second common port, and the third common port has a non-linear taper.

Example 18 includes the system of Example 17, wherein the edges of each common port have a Klopfenstein taper.

Example 19 includes the system of any of Examples 11-18, wherein each of the first common port, the second common port, and the third common port is curved.

Example 20 includes the system of Example 19, wherein the curve of each common port is a modified Fibonacci spiral.

Example 21 includes a method, comprising: coupling electromagnetic power into or out of a common port of a stripline radial power combiner propagating the electromagnetic power respectively to or from a common node of the stripline radial power combiner; and propagating, in substantially equal proportions in N radial arms, the electromagnetic power respectively received at or delivered from the common node.

Example 22 includes the method of Example 21, further comprising, coupling the substantially equal proportions electromagnetic power from each of the N radial arms respectively out of the stripline radial power combiner.

Example 23 includes the method of any of Examples 21-22, wherein propagating the electromagnetic power respectively to or from the common node of the stripline radial power combiner comprises propagating the electromagnetic power respectively to or from a first common node, and propagating the electromagnetic power respectively from the first common node to a second common node or to the first common note from the second common node; and wherein propagating, in substantially equal proportions in the N radial arms, the electromagnetic power respectively received at or delivered from the common node comprises propagating, in substantially equal proportions in the N radial arms, the electromagnetic power respectively received at or delivered from the second common node.

Example 24 includes a system, comprising: a first stripline radial power combiner, comprising: a first stripline level comprising a first set of at least two radial combiner arms coupled to a first common node; a second stripline level comprising a first common port coupled to a second common node; wherein the first stripline level is mounted over the second stripline level; and wherein the first common node and the second common node are coupled by a first conductive via through the first stripline level and the second stripline level; a second stripline radial power combiner, comprising: a third stripline level comprising a second set of at least two second radial combiner arms coupled to a third common node; and a fourth stripline level comprising a second common port coupled to a fourth common node; wherein the third stripline level is mounted over the fourth stripline level; and wherein the third common node and the fourth common node are coupled by a second conductive via through the third stripline level and the fourth stripline level; a third stripline radial power combiner, comprising: a fifth stripline level comprising a third set of at least two radial combiner arms coupled to a fifth common node; a sixth stripline level comprising a third common port coupled to a sixth common node; wherein the fifth stripline level is mounted over the sixth stripline level; and wherein the fifth common node and the sixth common node are coupled by a third conductive via through the fifth stripline level and the sixth stripline level; a fourth stripline radial power combiner, comprising: a seventh stripline level comprising a fourth set of at least two radial combiner arms coupled to a seventh common node; an eighth stripline level comprising a fourth common port coupled to an eighth common node; wherein the seventh stripline level is mounted over the eighth stripline level; and wherein the seventh common node and the eighth common node are coupled by a fourth conductive via through the seventh stripline level and the eighth stripline level; wherein the first stripline level or the second stripline level is mounted over the third stripline level or the fourth stripline level; and wherein the fifth stripline level or the sixth stripline level is mounted over the seventh stripline level or the eighth stripline level; at least two power amplifiers each of which has an input and an output; at least two low noise amplifiers each of which has an input and an output; wherein each power amplifier input is coupled to a unique radial combiner arm of the first set; wherein each power amplifier output is coupled to a unique radial combiner arm of the second set; wherein each low noise amplifier input is coupled to a unique radial combiner arm of the third set; and wherein each low noise amplifier output is coupled to a unique radial combiner arm of the fourth set.

Example 25 includes the system of Example 24, further comprising a radio coupled to the first common port and the third common port.

Example 26 includes the system of Example 25, further comprising a first antenna coupled to the second common port; and a second antenna coupled to the fourth common port.

Example 27 includes the system of any of Examples 25-26, wherein the first stripline level, the second stripline level, the third stripline level, or the fourth stripline level is mounted over the fifth stripline level, the sixth stripline level, the seventh stripline level, or the eight stripline level.

Example 28 includes the system of Example 27, wherein the first stripline level, the second stripline level, the third stripline level, or the fourth stripline level is attached, by non-conductive adhesive, to the fifth stripline level, the sixth stripline level, the seventh stripline level, or the eight stripline level.

Example 29 includes the system of any of Examples 24-28, wherein the first stripline level or the second stripline level is attached to the third stripline level or the fourth stripline level by a non-conductive adhesive; and wherein the fifth stripline level or the sixth stripline level is attached to the seventh stripline level or the eighth stripline level by a non-conductive adhesive.

Example 30 includes the system of any of Examples 24-29, wherein each pair of adjacent radial arms of the first set, each pair of adjacent radial arms of the second set, each pair of adjacent radial arms of the third set, and each pair of adjacent radial arms of the fourth set are each separated by the same angle.

Example 31 includes the system of any of Examples 24-30, wherein the first stripline radial power combiner further comprises a first intermediary dielectric layer separating the first stripline level and the second stripline level; wherein the first conductive via passes through the first intermediary dielectric layer; wherein the second stripline radial power combiner further comprises a second intermediary dielectric layer separating the third stripline level and the fourth stripline level; wherein the second conductive via passes through the second intermediary dielectric layer; wherein the third stripline radial power combiner further comprises a third intermediary dielectric layer separating the fifth stripline level and the sixth stripline level; wherein the third conductive via passes through the third intermediary dielectric layer; wherein the fourth stripline radial power combiner further comprises a fourth intermediary dielectric layer separating the seventh stripline level and the eighth stripline level; and wherein the fourth conductive via passes through the fourth intermediary dielectric layer.

Terms of relative position as used in this application are defined based on a plane parallel to the conventional plane or working surface of a layer or substrate, regardless of orientation. The term "horizontal" or "lateral" as used in this application are defined as a plane parallel to the conventional plane or working surface of a layer or substrate, regardless of orientation. The term "vertical" refers to a direction perpendicular to the horizontal. Terms such as "on," "side" (as in "sidewall"), "higher," "lower," "over," "top," and "under" are defined with respect to the conventional plane or working surface being on the top surface of a layer or substrate, regardless of orientation.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

The invention claimed is:

1. A stripline radial power combiner, comprising:
   a first stripline level comprising N radial combiner arms coupled to a first common node;
   a second stripline level comprising a transmission line transformer coupled to a second common node;
   wherein the first stripline level is mounted over the second stripline level; and
   wherein the first common node and the second common node are electrically coupled (a) by a conductive via through the first stripline level and the second stripline level, and (b) only along an axis of the conductive via that projects through the first stripline level and the second stripline level.

2. The stripline radial power combiner of claim 1, wherein each edge of the transmission line transformer has a non-linear taper.

3. The stripline radial power combiner of claim 1, wherein the transmission line transformer is curved.

4. The stripline radial power combiner of claim 1, wherein each pair of adjacent radial combiner arms are separated by an angle equal to three hundred and sixty degrees divided by N.

5. The stripline radial power combiner of claim 1, further comprising an intermediary dielectric layer separating the first stripline level and the second stripline level; and
   wherein the conductive via passes through the intermediary dielectric layer.

6. A stripline radial power combiner system, comprising:
   a first stripline radial power combiner, comprising:
      a first stripline level comprising a first set of N first radial combiner arms coupled to a first common node;
      a second stripline level comprising a first transmission line transformer coupled to a second common node; and
      wherein the first common node and the second common node are electrically coupled (a) by a first conductive via through the first stripline level and the second stripline level, and (b) only along an axis of the first conductive via that projects through the first stripline level and the second stripline level; and
   a second stripline radial power combiner, comprising:
      a third stripline level comprising a second set of N second radial combiner arms coupled to a third common node;
      a fourth stripline level comprising a second transmission line transformer coupled to a fourth common node; and
      wherein the third common node and the fourth common node are electrically coupled (a) by a second conductive via through the third stripline level and the fourth stripline level, and (b) only along an axis of the second conductive via that projects through the third stripline level and the fourth stripline level;
   wherein the first stripline level or the second stripline level is mounted over the third stripline level or the fourth stripline level.

7. The stripline radial power combiner system of claim 6, wherein the first stripline level or the second stripline level is attached to the third stripline level or the fourth stripline level by a non-conductive adhesive; and
   wherein each pair of adjacent radial combiner arms in the first set and each pair of adjacent radial combiner arms in the second set are each separated by an angle equal to three hundred and sixty degrees divided by N.

8. The stripline radial power combiner system of claim 6, wherein the first stripline radial power combiner further comprises a first intermediary dielectric layer separating the first stripline level and the second stripline level;
   wherein the first conductive via passes through the first intermediary dielectric layer;
   wherein the second stripline radial power combiner further comprises a second intermediary dielectric layer separating the third stripline level and the fourth stripline level; and
   wherein the second conductive via passes through the second intermediary dielectric layer.

9. A system, comprising:
   a first stripline radial power combiner, comprising:
      a first stripline level comprising a first set of at least two radial combiner arms coupled to a first common node;
      a second stripline level comprising a first common port coupled to a second common node; and
      wherein the first common node and the second common node are coupled by a first conductive via through the first stripline level and the second stripline level;
   a second stripline radial power combiner, comprising:
      a third stripline level comprising a second set of at least two second radial combiner arms coupled to a third common node; and
      a fourth stripline level comprising a second common port coupled to a fourth common node; and
      wherein the third common node and the fourth common node are coupled by a second conductive via through the third stripline level and the fourth stripline level;
   a third stripline radial power combiner, comprising:
      a fifth stripline level comprising a third set of at least two radial combiner arms coupled to a fifth common node;
      a sixth stripline level comprising a third common port coupled to a sixth common node; and
      wherein the fifth common node and the sixth common node are coupled by a third conductive via through the fifth stripline level and the sixth stripline level;
   wherein the first stripline level or the second stripline level is mounted over the third stripline level or the fourth stripline level;
   wherein the third stripline level or the fourth stripline level is mounted over the fifth stripline level or the sixth stripline level;
   a first duplexer and a second duplexer coupled to unique radial combiner arms of the third set;

a first power amplifier and a second power amplifier coupled to unique radial combiner arms of the second set;
a first low noise amplifier and a second low noise amplifier coupled to unique radial combiner arms of the third set;
wherein the first power amplifier and the second power amplifier are respectively coupled to the first duplexer and the second duplexer; and
wherein the first low noise amplifier and the second low noise amplifier are respectively coupled to the first duplexer and the second duplexer.

10. The system of claim 9, further comprising a radio coupled to the first common port and the second common port.

11. The system of claim 10, further comprising an antenna coupled to the third common port.

12. The system of claim 9, wherein the first stripline level or the second stripline level is attached to the third stripline level or the fourth stripline level by a non-conductive adhesive; and
wherein the third stripline level or the fourth stripline level is attached to the fifth stripline level or the sixth stripline level by a non-conductive adhesive.

13. The system of claim 9, wherein each pair of adjacent radial arms of the first set, each pair of adjacent radial combiner arms of the second set, and each pair of adjacent radial combiner arms of the third set are each separated by a same angle.

14. The system of claim 9, wherein the first stripline radial power combiner further comprises a first intermediary dielectric layer separating the first stripline level and the second stripline level;
wherein the first conductive via passes through the intermediary dielectric layer;
wherein the second stripline radial power combiner further comprises a second intermediary dielectric layer separating the third stripline level and the fourth stripline level;
wherein the second conductive via passes through the second intermediary dielectric layer;
wherein the third stripline radial power combiner further comprises a third intermediary dielectric layer separating the fifth stripline level and the sixth stripline level; and
wherein the third conductive via passes through the third intermediary dielectric layer.

15. The system of claim 9, wherein each edge of each of the first common port, the second common port, and the third common port has a non-linear taper.

16. The system of claim 9, wherein each of the first common port, the second common port, and the third common port is curved.

17. A system, comprising:
a first stripline radial power combiner, comprising:
a first stripline level comprising a first set of at least two radial combiner arms coupled to a first common node;
a second stripline level comprising a first common port coupled to a second common node;
wherein the first stripline level is mounted over the second stripline level; and
wherein the first common node and the second common node are coupled by a first conductive via through the first stripline level and the second stripline level;
a second stripline radial power combiner, comprising:
a third stripline level comprising a second set of at least two second radial combiner arms coupled to a third common node; and
a fourth stripline level comprising a second common port coupled to a fourth common node;
wherein the third stripline level is mounted over the fourth stripline level; and
wherein the third common node and the fourth common node are coupled by a second conductive via through the third stripline level and the fourth stripline level;
a third stripline radial power combiner, comprising:
a fifth stripline level comprising a third set of at least two radial combiner arms coupled to a fifth common node;
a sixth stripline level comprising a third common port coupled to a sixth common node;
wherein the fifth stripline level is mounted over the sixth stripline level; and
wherein the fifth common node and the sixth common node are coupled by a third conductive via through the fifth stripline level and the sixth stripline level;
a fourth stripline radial power combiner, comprising:
a seventh stripline level comprising a fourth set of at least two radial combiner arms coupled to a seventh common node;
an eighth stripline level comprising a fourth common port coupled to an eighth common node;
wherein the seventh stripline level is mounted over the eighth stripline level; and
wherein the seventh common node and the eighth common node are coupled by a fourth conductive via through the seventh stripline level and the eighth stripline level;
wherein the first stripline level or the second stripline level is mounted over the third stripline level or the fourth stripline level; and
wherein the fifth stripline level or the sixth stripline level is mounted over the seventh stripline level or the eighth stripline level;
at least two power amplifiers each of which has an input and an output;
at least two low noise amplifiers each of which has an input and an output;
wherein each power amplifier input is coupled to a unique radial combiner arm of the first set;
wherein each power amplifier output is coupled to a unique radial combiner arm of the second set;
wherein each low noise amplifier input is coupled to a unique radial combiner arm of the third set; and
wherein each low noise amplifier output is coupled to a unique radial combiner arm of the fourth set.

18. The system of claim 17, further comprising a radio coupled to the first common port and the third common port.

19. The system of claim 18, further comprising a first antenna coupled to the second common port; and
a second antenna coupled to the fourth common port.

20. The system of claim 18, wherein the first stripline level, the second stripline level, the third stripline level, or the fourth stripline level is mounted over the fifth stripline level, the sixth stripline level, the seventh stripline level, or the eighth stripline level.

21. The system of claim 20, wherein the first stripline level, the second stripline level, the third stripline level, or the fourth stripline level is attached, by non-conductive adhesive, to the fifth stripline level, the sixth stripline level, the seventh stripline level, or the eighth stripline level.

22. The system of claim 17, wherein the first stripline level or the second stripline level is attached to the third stripline level or the fourth stripline level by a non-conductive adhesive; and wherein the fifth stripline level or the sixth stripline level is attached to the seventh stripline level or the eighth stripline level by a non-conductive adhesive.

23. The system of claim 17, wherein each pair of adjacent radial combiner arms of the first set, each pair of adjacent radial combiner arms of the second set, each pair of adjacent radial combiner arms of the third set, and each pair of adjacent radial combiner arms of the fourth set are each separated by a same angle.

24. The system of claim 17, wherein the first stripline radial power combiner further comprises a first intermediary dielectric layer separating the first stripline level and the second stripline level;

wherein the first conductive via passes through the first intermediary dielectric layer;

wherein the second stripline radial power combiner further comprises a second intermediary dielectric layer separating the third stripline level and the fourth stripline level;

wherein the second conductive via passes through the second intermediary dielectric layer;

wherein the third stripline radial power combiner further comprises a third intermediary dielectric layer separating the fifth stripline level and the sixth stripline level;

wherein the third conductive via passes through the third intermediary dielectric layer;

wherein the fourth stripline radial power combiner further comprises a fourth intermediary dielectric layer separating the seventh stripline level and the eighth stripline level; and wherein the fourth conductive via passes through the fourth intermediary dielectric layer.

\* \* \* \* \*